United States Patent [19]

Price

[11] Patent Number: 4,563,974

[45] Date of Patent: Jan. 14, 1986

[54] APPARATUS FOR THE APPLICATION OF SOLDER TO WORKPIECES

[75] Inventor: Robert G. Price, Bicknell, Ind.

[73] Assignee: Monitrol, Inc., Vincennes, Ind.

[21] Appl. No.: 532,787

[22] Filed: Sep. 16, 1983

[51] Int. Cl.$^4$ .............................................. B05C 3/10
[52] U.S. Cl. ...................................... 118/66; 118/63; 118/69; 118/206; 118/302; 118/304; 118/404; 118/425
[58] Field of Search .................. 427/334, 376.7, 376.6, 427/96, 97, 376.8; 118/429, 641–643, 402, 403, 64, 69, 404, 66, 63, 206, 302, 304, 425; 134/108; 228/20, 36, 40

[56] References Cited

U.S. PATENT DOCUMENTS

| | | | |
|---|---|---|---|
| 2,370,495 | 2/1945 | Sebell | 118/403 |
| 3,190,527 | 6/1965 | Tardoskegyi | 118/429 X |
| 3,893,409 | 7/1975 | Rote | 118/402 X |
| 3,924,794 | 12/1975 | Allen et al. | 427/349 X |
| 4,315,042 | 2/1982 | Spigarelle | 427/96 |

*Primary Examiner*—John P. McIntosh
*Attorney, Agent, or Firm*—Roberts, Spiecens and Cohen

[57] ABSTRACT

A soldering technique is provided especially for printed circuit boards wherein a bath of solder assisting fluid such as non-ionic surface active agent is superposed on a bath of solder. In one form, the workpiece is passed through the bath of solder assisting fluid and solder is pumped from the bath of solder to a trough whereat the solder is cascaded onto the workpiece. In another form, the workpiece is passed downwardly through the bath of solder assisting fluid into the bath of solder for the application of solder to the workpiece. Thereafter, the workpiece is withdrawn from the bath of solder through the bath of solder assisting fluid. In both instances, while the workpiece is still within the bath of solder assisting fluid, jets of this fluid are played against the workpece to control the thickness of the solder which is allowed to remain on the workpiece. This is accomplished by immersion of fluid levelling knives in the bath of solder assisting fluid with jets being played by these knives onto the workpiece. In addition, provision is made for air blowing the workpiece to remove the solder assisting fluid therefrom. Thereafter, the workpiece is cooled, rinsed and dried.

14 Claims, 2 Drawing Figures

APPARATUS FOR THE APPLICATION OF SOLDER TO WORKPIECES

FIELD OF INVENTION

This invention relates to soldering techniques and the like and more particularly to techniques and apparatus for the application of solder to workpieces such as printed circuit boards.

BACKGROUND

In researching the present invention, a number of patents have been discovered which relate generally, but not specifically, to the subject matter of the present invention. These patents include the following: U.S. Pat. Nos. 406,365; 2,774,684; 3,359,132; 3,535,157; 3,620,805; 3,672,043; 3,704,165; 3,776,771; 3,877,975; 3,924,794; 3,941,906; 4,277,518; 4,352,838; and 3,325,302.

Theodore Bostroem in U.S. Pat. No. 3,941,906 reveals a dip metallizing process which consists of passing an article to be metallized through a bath of molten metal such as lead and and conducting the article therefrom through a layer of molten coating metal such as zinc which is confined in a stack-like structure of a cross-sectional area which is a small fraction of the surface area of the heavy metal bath. The molten coating metal is continuously supplied to the stack through orifices so as to remove droplets of molten heavy metal adhering to the surface of the article. As will appear hereinbelow, this patent is not suggestive of submerged levelling knives which employ a surrounding liquid in order to remove excess material. Consequently, this patent relates somewhat in general to subject matter contained in the instant application but not specifically thereto.

David Shepard shows in U.S. Pat. No. 3,776,771 a provision for the application of an etch resist coating to plated holes in a printed circuit board. While this particular patent shows the use of horizontal rolls, and a horizontal workpiece, as well as the removal of excess material in connection therewith, the Shepard Patent does not show the use of levelling knives or superposed baths in the manner to be described in greater detail hereinbelow.

In U.S. Pat. No. 2,774,684, A. M. Fucinari discloses an invention which relates to dry film type drawing lubricants and methods and apparatus for applying compositions to sheet metal prior to forming articles therefrom. While this patent shows the use of series of horizontal rollers working with a horizontal workpiece, it shares little else with the techniques and apparatus of the present invention which is not directed to applying lubricants to sheet metal. As will be shown, this patent does not disclose the delimiting of a bath by means of horizontal rollers nor does it reveal many of the other features of the invention.

Travis Allen reveals in U.S. Pat. No. 3,924,794 the removal of excess or undesirable solder from printed circuit boards that may contain through-holes, conductors, connectors or the like. In this patent, printed circuit boards are covered with a liquid flux and contacted with a liquid solder and are removed from the solder and subsequently passed between hot gas jets which flow hot gas under pressure onto the boards to sweep off undesired solder, clear the holes, and leave an optimum thickness solder layer. This technique does not achieve the excellent results achieved with the levelling knives employed in conjunction with the present invention as will be discussed in greater detail hereinbelow.

In the McLain U.S. Pat. No. 3,704,165 is disclosed an invention relating to printed circuit boards which have been previously solder plated. The liquid involved has to be substantially above the melting point of the solder in order to be effective. This creates hot spots where there are large areas of copper resulting in thin coatings at the related points. The holes in the board also create a surface turbulence which further contributes to a non-uniform coating. In addition, the operation is extremely messy because of the fumes caused by the high operating temperature. This patent fails to reveal the use of submerged jets in the manner which will be discussed in greater detail hereinbelow.

The Schillke U.S. Pat. No. 4,277,518 employs a solder station. The use of submerged levelling knives is not suggested herein. Similarly, no use is made in this patent of rollers which both delimit the extent of a bath of solder assisting fluid while at the same time constituting the entry and exit for workpieces to be soldered. Consequently, there are distinct differences between the invention disclosed in this patent and the invention which will be discussed hereinbelow.

Other of the patents which have been mentioned hereinabove may relate to isolated details of the structure and technique to be discussed hereinafter. However, none of these patents, taken separately or in combination, reveals the inventive concept which will be found in the description which follows hereinbelow.

SUMMARY OF INVENTION

There are a wide number of features which are employed in accordance with the invention. According to one of these features, solder is applied while the workpiece is submerged in a fluid, thus protecting it and the components thereof from oxidation. Further, as will be shown, solder is cascaded onto a workpiece and is also applied thereto by roller contact. At the same time, the workpiece is subjected to a squeegee type action insuring that holes in the workpiece are coated and that excess is removed. All of this is effected in a submerged condition of the workpiece.

Still other features of the invention include the technique whereby the thickness of the still molten solder can be closely controlled because levelling knives are employed which utilize pumped liquid to apply the same in jets or the like against the workpiece which is in heated and submerged condition. In addition, as another feature of the invention, there is made a use of rollers to contain and delimit a fluid bath with respect to which an underlying solder bath acts as a lower seal. Still further, air is employed only to remove excess solder assisting fluid from workpieces after the solid state is reached so that there is no oxidation of either the fluid or the solder.

It is an object of the invention to provide improved apparatus and methods for the application of solder or the like to workpieces such as printed circuit boards.

It is another object of the invention to provide methods and apparatus for the close control of the thickness of deposited solder layers or the like.

Yet another object of the invention is to provide improved techniques and apparatus for the soldering of workpieces while minimizing oxidation not only of the workpieces being treated, but also of the solder and solder assisting fluids which may be employed.

Yet another object of the invention is to provide improved techniques and apparatus which effect a great economy in the handling of workpieces during solder applications.

It is another object of the invention to provide apparatus and techniques which are significant in improvements over techniques and apparatus disclosed by previously granted patents.

There are various ways in which the invention may be broadly regarded. For example, in achieving the above and other objects of the invention, the soldering apparatus thereof, may be regarded as being an apparatus for applying solder to various types of workpieces. Some of these workpieces may preferably be of a flat and generally planar configuration. An example of such a workpiece is a printed circuit board which may include circuitry as well as holes which are rimmed with a metal capable of receiving a solder application.

In accordance with one aspect of the invention, this apparatus may be regarded as comprising a first arrangement for applying solder to the aforesaid workpiece, a second arrangement in operative association with the first arrangement to provide a bath of solder assisting fluid in which to receive the aforesaid workpiece and provide a medium in which the solder can be applied, and a conveying arrangement for conveying the workpiece into operative relationship with the first arrangement for the application of the solder to the workpiece. This conveying arrangement will, moreover, convey the workpiece into the bath of solder assisting fluid and the arrangement and sequence by which the workpiece enters the bath of solder assisting fluid and has solder applied thereto constitutes features of the various embodiments of the invention as will become apparent hereinafter. Moreover, as will be seen, the invention provides for a levelling arrangement which is immersed in the bath of solder assisting fluid to direct at least one jet of this fluid against the workpiece while the workpiece is immersed in the bath of solder assisting fluid whereby to dislodge excess solder from the workpiece and to control the thickness of the solder which is applied to the workpiece.

In the above generalized description, reference has been made to a bath of solder assisting fluid. This fluid may, for example, be a bath of levelling oil or fluid. By way of example, the levelling oil may be a bath of a non-ionic surfactant. Also by way of example, the non-ionic surfactant may be a bath of nonylphenol ethoxylate.

According to another feature of the invention, the aforesaid conveying arrangement will be such as to convey the workpiece out of the bath of solder assisting fluid with an air blowing arrangement being provided to direct air against the workpiece after the workpiece has moved out of the bath of solder assisting fluid whereby to remove any remaining fluid from the workpiece.

In accordance with yet another feature of the invention, as has been generally indicated above, the first arrangement referred to hereinabove may include a bath of solder upon which rests the bath of solder assisting fluid. The bath of solder assisting fluid will be generally arranged to cover, at least almost in entirety, the upper surface of the bath of solder effectively to form a seal with the same.

In accordance with one embodiment of the invention, the conveying arrangement will include a conveyor to convey workpieces at least generally horizontally through the bath of solder assisting fluid. The second arrangement in this case will include a soldering arrangement to remove solder from the bath of solder and to deposit the thusly removed solder onto the workpiece being treated while the workpiece is immersed in the bath of solder assisting fluid. According to another embodiment of the invention, the conveying arrangement will include a conveyor to convey the workpiece at least generally vertically downwards through the bath of solder assisting fluid into the bath of solder and then upwardly through and out of the bath of solder assisting fluid.

According to yet another feature of the invention, the levelling arrangement referred to hereinabove, will include at least one pair of fluid levelling knives, each including an elongated tube provided with a longitudinally aligned elongated slot. These tubes will preferably be arranged in horizontal attitude.

Yet another feature of the invention relates to the provision, in cooperative disposition with the aforegoing, of an arrangement to cool, rinse and dry workpieces after exposure of the same to the levelling arrangement.

In one of the embodiments mentioned hereinabove, the soldering arrangement will include a trough located above the conveying arrangement in the bath of solder assisting fluid. This trough will preferably be of open construction to provide for the cascading of solder downwardly onto the workpiece being treated. In this embodiment, the second arrangement mentioned above will include first and second pairs of rollers constituting walls delimiting the bath of solder assisting fluid and respectively constituting an entry into and an exit from the bath of solder assisting fluid. In this embodiment, furthermore, there will be provided a reservoir to receive excess fluid from the bath of solder assisting fluid so that such excess fluid may be stored and re-utilized to provide an automatically operating arrangement. In this arrangement, furthermore, provision will be made to heat the solder assisting fluid thereby to provide for heating the workpiece being treated and immersed therein.

Yet another feature of the aforementioned embodiment of the invention is that whereby the first arrangement mentioned above includes a pair of rollers at least partly immersed in the bath of solder assisting fluid and including one roller extending downwardly into the bath of solder and being of a material adapted for becoming coated with the solder. In this embodiment, a spring loaded roller is urged towards the first said roller and includes a Teflon coating to define with the first said roller a passage for the workpiece being treated. In this arrangement the lower part of the workpiece will be coated by the aforementioned roller which is of a material adapted for becoming coated with solder while the upper part of the workpiece will be coated by solder cascading down from the above-mentioned trough.

In the second generally mentioned embodiment of the invention, the first and second arrangement related hereinabove define vertically co-extensive chamber portions. The second arrangement in this case is provided with a vertical entry port through which the conveying arrangement can lower a workpiece to be treated. In this arrangement, as well as in the aforegoing embodiment, an arrangement may be provided to pump fluid from the bath of solder assisting fluid through the aforesaid levelling arrangement. Moreover, an air blowing arrangement may be superposed above the bath of solder assisting fluid for blowing air against the workpiece as it is being moved in order to remove remaining solder assisting fluid therefrom. In this embodiment, an arrangement can also be provided for venting the chamber portion of the second said arrangement.

The above and other objects, features and advantages of the invention will become apparent from the detailed description which follows hereinafter as illustrated in the accompanying drawing.

DETAILED DESCRIPTION

Figure 1:
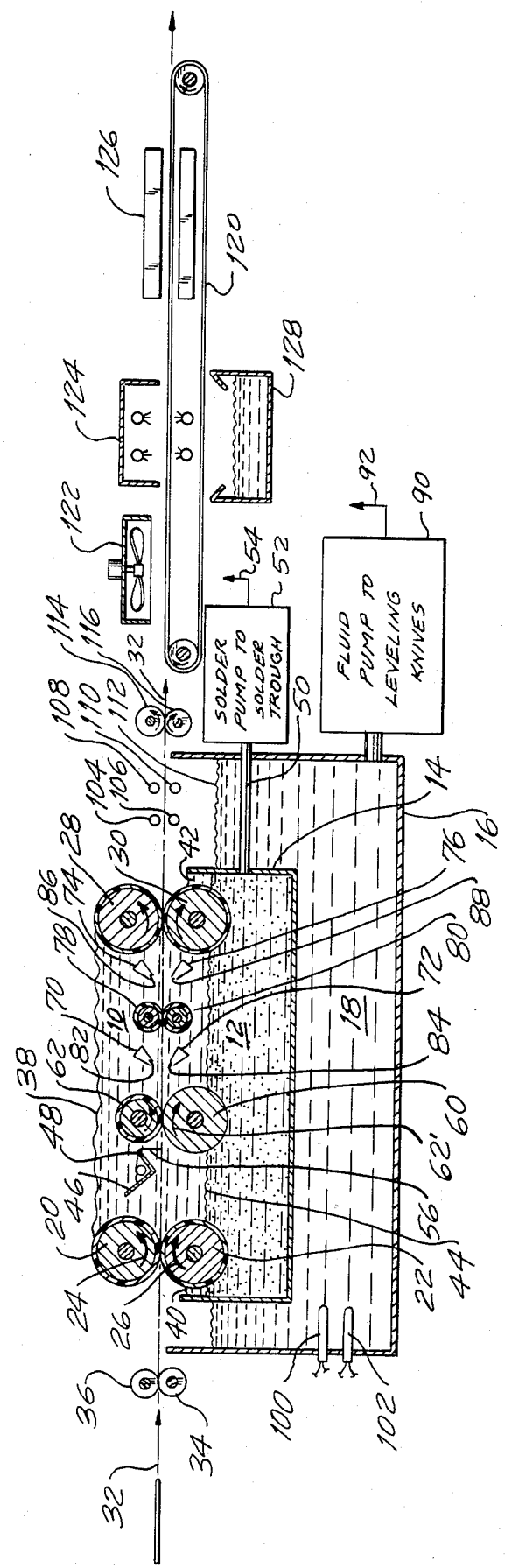
FIG. 1 is a diagrammatic view illustrating a first embodiment of the invention which employs a generally horizontal conveying arrangement.

In the embodiment of the invention illustrated in FIG. 1, solder is literally immersed in a suitable oil such as a levelling or soldering fluid which is maintained at a temperature of, for example, 450° F. by electric heaters or the like. Fluid containment rollers are made of steel with a nonwetting Teflon sleeve. These rollers have seals at each end and are spring loaded from the top thereby effecting a seal between the rollers so that they contain the solder assisting fluid. The fluid level is maintained by a pump which circulates the oil or the like from a main reservoir through fluid levelling knives in sufficient volume to maintain the level and cause the oil to spill over the rollers into the solder pot and thence back to the main reservoir. The fluid levelling knives, as will be seen, are tubes with longitudinal slots mounted directly above and below the path of the workpiece being treated. The rollers between the levelling knives are Teflon material coated to prevent any transfer of solder and serve to transport the workpiece through the levelling knives.

The solder coating roller to be referred to hereinbelow is preferably of a metal such as steel and becomes coated with solder because it rotates in partially submerged condition in the molten solder as well as in the bath of solder assisting fluid. Mounted directly over it is a spring loaded Teflon material coated pressure roller which forces the workpiece downwardly against the steel roller. A solder trough rests in front of the pressure roller, extends the length of the solder coating roller and is fed at one end with solder from a solder pump. The molten solder uniformly cascades over the rear edge of the trough and falls onto the surface of the workpiece, or simply falls back into the solder itself. The entire soldering function is carried on while the workpiece is totally immersed in the oil. Neither the copper on the printed circuit panels, for example, nor the solder itself is ever exposed to air. The air blowing tubes at the exit end chill the solder and remove excess oil from the workpiece as it passes adjacent these tubes. The excess oil is returned to the main reservoir.

In operation, the workpiece enters from the left hand side of FIG. 1 and is carried forward by the transport rollers. There is sufficient resilience in the Teflon material coated containment rollers to allow the workpiece (which may be for example 1/16" thick) to pass through between the rollers while maintaining a seal along the edges thereof. The pump volume associated therewith is sufficient to overcome any leakage. As the workpiece passes through the containment rollers, it enters the hot oil or solder assisting fluid where the workpiece has time to pre-heat before the application of the solder.

The solder cascades onto the top surface of the panel and as the panel advances, the bottom of the workpiece makes tangential contact with the solder coating roller which coats the lower side of the workpiece. At the same time, the upper roller squeegees off the excess solder forcing it into and through the plated holes which may exist in the workpiece. Excess solder falls back into a bath where it is reused.

The workpiece then passes through two banks of submerged levelling knives separated by a Teflon material coated transport roller. The soldering fluid pumped through the longitudinal slots in these levelling knives has sufficient force to remove any excess solder from both surfaces of the panel and the plated holes, if any, thereby levelling the solder coating and controlling the thickness thereof.

When the workpiece exits through the right hand containment rollers, low pressure air blows off remaining excess fluid which falls into the main reservoir for re-use. The blowers simultaneously cool the panel sufficiently to solidify the solder.

A novel feature in the above is the technique of acquiring solder coating while the workpiece is submerged in fluid during the application of solder. It should be noted that the solder itself does not oxidize, because it also has no contact with air. By automatically adding makeup quantities of oil and solder, the system becomes completely automatic. Not only does the system conserve materials such as solder assisting fluid and the solder itself, but the through put of the system in FIG. 1 is advantageously quite rapid.

Referring next to FIG. 1, therein appears a bath 10 of solder assisting fluid and a bath 12 of solder to be applied to a workpiece. The bath 12 of the solder is confined in a casing 14. A reservoir 16 is furthermore provided in which the casing 14 is substantially in nesting relationship. In reservoir 16 is contained a source 18 of soldering fluid which is generally called solder assisting fluid hereinbelow. This fluid may, for example, be a non-ionic surfactant such as nonylphenol ethoxylate having, for example, nine moles of ethylene oxide. One such suitable product is marketed as "Tergitol" by Union Carbide. Another suitable product is available as "Igepal" from G.A.F. The bath 10 is confined at its leading end by a first pair of rollers 20 and 22. These rollers are horizontally disposed about spaced parallel horizontal axes. They are fluid containment rollers and are preferably Teflon material coated. They are rotated in the direction indicated by arrows 24 and 26.

The trailing end of the bath 10 is confined by a pair of rollers 28 and 30. These rollers are constructed in a manner which is similar to that of rollers 20 and 22; i.e. they are Teflon material coated. The rollers of each of these pairs are arranged in contacting relationship so as to be able to pass therebetween a workpiece such as a printed circuit board which passes along a workpath indicated at 32. The workpiece may be transported into the system by one or more pairs of transport rollers such as the rollers indicated at 34 and 36. The bath 10 is laterally confined by walls (not shown). The ends of rollers 22, 24, 28 and 30 are arranged with a sealing gasket so as to be in sealing relationship with the lateral walls. The upper surface of bath 10 is indicated at 38. When the fluid in bath 10 exceeds the height of the upper extremities of rollers 20 and 28, this fluid overflows into bath portions 40 and 42 thereby to complete the seal which is formed with the solder bath 12 as indicated at seal surface 44.

Arranged in submerged relationship with bath 10 is a trough 46. This trough has a trailing edge indicated at 48 over which solder fed through the trough spills in cascading relationship to path 32 thereby to coat the upper surface of a workpiece being transported by the related conveying device diagrammatically indicated at 32 as well as by rollers 20 and 22 and the other rollers which have been mentioned or which will be mentioned hereinbelow. Excess solder again falls into bath 12.

Solder from bath 12 is pumped via conduit 50 and pump 52 via line 54 into one end of the trough 46. The solder spreads along the trough 46 and when it exceeds the level of end 48, cascades downwardly as indicated at 56 thereby to coat the upper surface of the workpiece as has been noted hereinabove. The height of the bath 12 in casing 14 is not too critical. It is essential that the bath contact the solder coating roller to be discussed next hereinbelow but, aside from this, the solder will be constantly recycled between the bath 12 and trough 46 by pump 52 whereat additions of soldering material may be applied to make up for the consumption of solder as workpieces are being treated.

Following downstream of the trough 46 is a pair of rollers 60 and 62. Roller 60 is preferably, as has been indicated hereinabove, of a material such as steel which will become coated by the solder by bath 12. Roller 60 rotates in the direction indicated by arrow 62'. The coating of rollers 60 by the solder enables coating the lower surface of the workpiece being treated in a manner which has been generally alluded to hereinabove. The workpiece is forced against roller 60 by spring loaded roller 62 which is preferably Teflon material coated to enable the passage of the workpiece along the path 32 between these two rollers.

Also arranged in submerged relationship to bath 10 are a first pair of levelling knives 70 and 72 and a second pair of levelling knives 74 and 76. Between these pairs of levelling knives is arranged a pair of rollers 78 and 80 serving as transport rollers to aid in the conveyance of the workpiece between the levelling knives. The levelling knives are tubes which may be circular or of other cross sectional configuration which are arranged in horizontal attitude. These knives are provided with horizontal elongated slots 82, 84, 86 and 88 which extend along the length of the tubes. Solder assisting fluid removed from bath 18 by pump 90 is conveyed via line 92 to the levelling knives 70, 72, 74 and 76. This fluid passes in the form of jets out of the aforementioned slots and is directed against the upper and lower surfaces of the workpiece thereby to remove excess solder therefrom and to control the thickness of the deposit of solder on the workpiece being treated. The strength with which the fluid is forced against the workpiece may be controlled by control of the pump 90 thereby to select empirically or otherwise the nature of the control being exercised on the final form of the solder on the workpiece. The novel aspect of submerging the levelling knives in the bath 10 enables a close control of the solder deposition to a degree not believed previously achieved.

It should be noted that the bath 18 is provided with heaters indicated, by way of example, at 100 and 102. The purpose of these heaters is to heat the fluid in bath 18 thereby to control the temperature of bath 10 which controls the preheating of the workpiece to which solder is being applied. The workpiece then passes between rollers 28 and 30 thereafter to pass between pairs of air blowing tubes 104 and 106 on the one hand, and 108 and 110 on the other hand. These air blowing tubes serve to direct air against the workpiece and to remove excess fluid therefrom. This excess fluid falls onto the surface 112 of bath 18 thereby to enable a recovery of this fluid.

Further transport rolls are indicated at 114 and 116. The workpiece then continues along path or conveyor arrangement 32 onto a conveyor belt 120 whereat the workpiece is exposed to a cooling fan indicated at 122, a water rinse indicated generally at 124 and a drying arrangement of infrared heaters or the like indicated at 126. A sump 128 is provided for recovery of the rinse water which is recirculated. The workpiece is thus subjected to a cooling, rinsing and drying following its having been subjected to a soldering operation of the aforenoted type.

Figure 2:
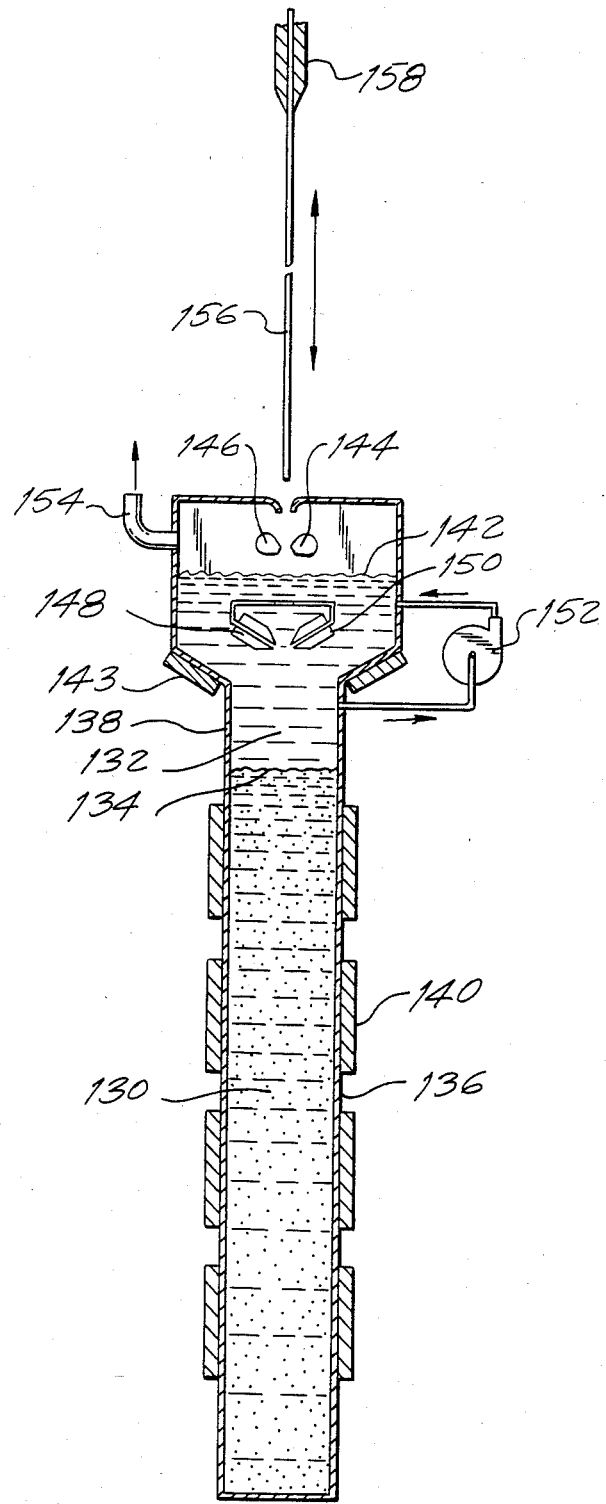
FIG. 2 is a diagrammatic representation of a second embodiment of the invention in accordance with which a generally vertical conveying arrangement is employed.

FIG. 2 illustrates a second embodiment of the invention involving a vertical conveyance rather than the horizontal conveyance which has been discussed in detail hereinabove. In FIG. 2, there is provided a bath of solder indicated at 130 and a bath of solder assisting fluid indicated at 132. These baths are superposed and contact in fluid sealing relationship at surface 134. To this end, there is provided a casing 136 upon which is superposed a casing portion 138. These casings or casing portions define superposed chamber portions in which the aforenoted baths are accommodated.

Heaters are indicated at 140 for heating the solder in bath 130. A heater arrangement is also indicated at 143 for heating the fluid in bath 132 for the purpose mentioned hereinabove with respect to FIG. 1.

The bath 132 has an upper surface indicated at 142. Above this surface is located a pair of air blowing tubes 144 and 146 performing the air blowing function which has been noted hereinabove with respect to FIG. 1.

Below the surface 142 and within the bath 132 is provided a pair of levelling knives 148 and 150. These levelling knives may be elongated tubes or the like provided with elongated slots which will pass along at least the entire breadth of the type of workpiece to be treated. A pump 152 is provided which withdraws fluid from bath 132 and directs the same through knives 148 and 150 and the elongated slots provided therein against the workpiece being treated to control the deposition or removal of solder on or from the workpiece in a manner which has been alluded to hereinabove.

The upper portion of the chamber in which are housed the air blowing tubes 144 and 146 may be provided with a vent such as indicated at 154. The vertical conveyor is indicated at 156 along with a clamping device 158 thereon of conventional form for purposes of grasping a workpiece and lowering the same through bath 132 into solder bath 130 whereat the solder is applied to the workpiece. The workpiece is then withdrawn upwardly through bath 132 between the levelling knives 148 and between air blowing tubes 144 and 146 all for purposes of controlling the deposition of solder and the thickness thereof as well as removing excess fluid from the workpiece being treated. Excess solder falls back into the solder bath for reuse.

From what has been described above with respect to both FIGS. 1 and 2, it will now be seen that the invention relates to a method in accordance with which a bath of solder assisting fluid is superposed directly on a bath of solder. A workpiece is introduced into the bath of solder assisting fluid and then solder is applied from the bath of solder onto the workpiece. The workpiece can be withdrawn through the bath of solder assisting fluid and, while the workpiece is in the bath of solder assisting fluid, at least one jet of this jet fluid is directed against the workpiece. Actually and preferably, at least two jets of fluid are directed against the workpiece from opposite sides thereof in order to control the thickness of the solder permitted to reside on the workpiece.

According to one embodiment, the workpiece is lowered downwardly from the bath of solder assisting fluid into the bath of solder for the application of solder onto the workpiece. According to the other embodiment, solder is removed from the bath of solder for application to the workpiece while the workpiece remains immersed in the bath of solder assisting fluid. In both instances, the workpiece is preferably pre-heated by a heating of the solder assisting fluid and preferably, the excess fluid is removed from the workpiece by blowing and is recovered for further use. As has been implied hereinabove, the solder assisting fluid is a levelling oil or the like which may preferably be a non-ionic surfactant. In the preferred embodiment of the invention, the upper surface of the bath of solder is substantially completely concealed with the bath of solder assisting fluid.

There will now be obvious to those skilled in the art many modifications and variations of the methods and apparatus set forth hereinabove. These modifications and variations will not depart from the scope of the invention if defined by the following claims.

What is claimed is:

1. Soldering apparatus for applying solder to a workpiece, said apparatus comprising first means for applying solder to said workpiece, second means in operative association with said first means to provide a bath of solder assisting fluid in which to receive said workpiece and provide a medium in which the solder can be applied, conveying means for conveying said workpiece into operative relationship with said first means for the application of said solder to said workpiece, said conveying means conveying said workpiece into said bath of solder assisting fluid, and levelling means immersed in said bath of solder assisting fluid to direct at least one jet of said fluid against the workpiece while the workpiece is immersed in said bath of solder assisting fluid whereby to dislodge excess solder from the workpieces, said first means including a bath of solder upon which rests the bath of solder assisting fluid, said bath of solder being positioned to receive the thusly dislodged excess solder, said conveying means including means to convey the workpiece at least generally horizontally through said bath of solder assisting fluid, said first means further comprising soldering means to remove solder from the bath of solder and to deposit the thusly removed solder on the workpiece while the workpiece is immersed in the bath of solder assisting fluid.

2. Soldering apparatus as claimed in claim 1 wherein said second means includes a bath of levelling oil.

3. Soldering apparatus as claimed in claim 1 wherein said bath of levelling oil is a bath of a non-ionic surfactant.

4. Soldering apparatus as claimed in claim 3 wherein said bath of a non-ionic surfactant is a bath of nonylphenol ethoxylate.

5. Soldering apparatus as claimed in claim 1 wherein said conveying means conveys said workpiece out of said bath, said apparatus comprising air blowing means to direct air against the workpiece upon conveyance of the workpiece out of said bath whereby to remove solder assisting fluid therefrom.

6. Solder apparatus as claimed in claim 1 wherein the levelling means includes at least one pair of fluid levelling knives each including an elongated tube provided with a longitudinally aligned elongated slot.

7. Soldering apparatus as claimed in claim 6 wherein the tubes are arranged in horizontal attitude.

8. Soldering apparatus as claimed in claim 1 comprising means to cool, rinse and dry the workpiece after exposure of the workpiece to said levelling means.

9. Soldering apparatus as claimed in claim 1 wherein said soldering means includes a trough located above said conveying means in said bath of solder assisting fluid, said trough being of open construction to provide for the cascading of solder downwardly onto said workpiece.

10. Soldering apparatus as claimed in claim 1 wherein said second means includes first and second pairs of rollers constituting walls delimiting the bath of solder assisting fluid and respectively constituting an entry into and exit from the latter said bath, said conveying means conveying said workpiece between the rollers of the first pair into the bath of solder assisting fluid and out of the latter said bath between the rollers of the second pair.

11. Soldering apparatus as claimed in claim 10 comprising a reservoir to receive excess fluid from the bath of solder assisting fluid.

12. Soldering apparatus as claimed in claim 11 comprising means in the reservoir to heat the solder assisting fluid.

13. Soldering apparatus as claimed in claim 10 wherein said first means includes a pair of rollers at least partly immersed in said bath of solder assisting fluid and including one roller extending downwardly into the bath of solder and being of a material adapted for becoming coated with solder and a spring loaded roller urged towards said one roller and including a Teflon coating to define with said one roller a passage for said workpiece.

14. Soldering apparatus as claimed in claim 13 wherein the levelling means includes at least one pair of fluid levelling knives each including an elongated tube provided with a longitudinally aligned elongated slot.

* * * * *